United States Patent
Gilleo et al.

(10) Patent No.: US 6,204,455 B1
(45) Date of Patent: Mar. 20, 2001

(54) MICROELECTRONIC COMPONENT MOUNTING WITH DEFORMABLE SHELL TERMINALS

(75) Inventors: Kenneth B. Gilleo, Chepachet, RI (US); Konstantine Karavakis, Pleasanton, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 09/345,548

(22) Filed: Jun. 30, 1999

Related U.S. Application Data

(62) Division of application No. 08/777,307, filed on Dec. 27, 1996, now Pat. No. 5,971,253, which is a continuation of application No. 08/681,847, filed on Jul. 29, 1996, now abandoned.
(60) Provisional application No. 60/001,669, filed on Jul. 31, 1995.

(51) Int. Cl.[7] ............... H01R 12/04; H05K 1/11
(52) U.S. Cl. ........................... 174/261; 174/262
(58) Field of Search .................. 174/261, 262, 174/263, 265, 266; 361/772, 773, 774, 760, 803

(56) References Cited

U.S. PATENT DOCUMENTS

| 4,001,870 | 1/1977 | Saiki et al. ............... 357/54 |
| 4,365,264 | 12/1982 | Mukai et al. ............. 357/54 |
| 4,538,105 | 8/1985 | Ausschnitt ............ 324/158 R |
| 4,618,878 | 10/1986 | Aoyama et al. ............ 357/71 |
| 4,695,870 | 9/1987 | Patraw ..................... 357/74 |
| 4,716,049 | 12/1987 | Patraw ..................... 427/96 |
| 4,792,532 | 12/1988 | Ohtani et al. ............ 437/206 |
| 4,813,129 | 3/1989 | Karnezos ................. 29/832 |
| 4,902,606 | 2/1990 | Patraw ..................... 430/314 |
| 4,994,735 | 2/1991 | Leedy ................... 324/158 F |
| 5,020,219 | 6/1991 | Leedy ..................... 29/846 |
| 5,070,297 | 12/1991 | Kwon et al. ............ 324/158 P |
| 5,072,520 | 12/1991 | Nelson ..................... 29/852 |
| 5,103,557 | 4/1992 | Leedy ..................... 29/832 |
| 5,120,665 | 6/1992 | Tsukagoshi et al. ............ 437/8 |
| 5,135,890 | 8/1992 | Temple et al. ............ 437/215 |
| 5,148,265 | 9/1992 | Khandros et al. ............ 357/80 |
| 5,148,266 | 9/1992 | Khandros et al. ............ 357/80 |
| 5,153,507 | 10/1992 | Fong et al. ............ 324/158 R |
| 5,180,311 | 1/1993 | Schreiber et al. ............ 439/74 |
| 5,307,561 | * 5/1994 | Feigenbaum et al. ............ 29/846 |
| 5,319,159 | * 6/1994 | Watanabe et al. ............ 174/262 |
| 5,321,583 | 6/1994 | McMahon ................. 361/770 |

(List continued on next page.)

FOREIGN PATENT DOCUMENTS

| 58-138058 | 8/1983 | (JP) . |
| 59-148345 | 8/1984 | (JP) . |
| 59-154035 | 9/1984 | (JP) . |
| 62-245640 | 10/1987 | (JP) . |

OTHER PUBLICATIONS

International Interconnection Intelligence Flip Chip Technoloy Impact Report, "Chip on Glass Approach," pp. 79–80.

First International Symposium on Flip Chip Technology, "Compliant Bumps for Adhesive Flip Chip Assembly," pp. 66–73.

Anonymous, 32290, Methods of Testing Chips and Joining Chips to Substrates, 2244 Research Disclosure, Feb., 1991.

*Primary Examiner*—Jeffrey Gaffin
*Assistant Examiner*—Jeremy Norris
(74) *Attorney, Agent, or Firm*—Lerner, David, Littenberg, Krumholz & Mentlik, LLP

(57) ABSTRACT

A microelectronic element assembly such as a semiconductor chip assembly uses a connection component incorporating a dielectric sheet with electrically conductive elements therein. Each electrically conductive element may include a flexible shell. The flexible shells can be formed to assure reliable engagement with mating contact pads.

20 Claims, 3 Drawing Sheets

U.S. PATENT DOCUMENTS

| | | | |
|---|---|---|---|
| 5,393,697 | 2/1995 | Chang et al. | 437/183 |
| 5,401,911 * | 3/1995 | Anderson et al. | 174/262 |
| 5,410,807 * | 5/1995 | Bross et al. | 29/843 |
| 5,428,190 * | 6/1995 | Stopperan | 174/261 |
| 5,430,329 | 7/1995 | Harada et al. | 257/786 |
| 5,431,328 | 7/1995 | Chang et al. | 228/180.22 |
| 5,440,241 | 8/1995 | King et al. | 324/765 |
| 5,455,390 | 10/1995 | DiStefano et al. | 174/262 |
| 5,578,527 | 11/1996 | Chang et al. | 437/209 |
| 5,604,380 | 2/1997 | Nishimura et al. | 257/758 |
| 5,666,270 | 9/1997 | Matsuda et al. | 361/704 |
| 5,679,977 | 10/1997 | Khandros et al. | 257/692 |
| 5,699,612 * | 12/1997 | Inoue et al. | 29/843 |
| 5,749,997 | 5/1998 | Tang et al. | 156/249 |

* cited by examiner

MICROELECTRONIC COMPONENT MOUNTING WITH DEFORMABLE SHELL TERMINALS

CROSS REFERENCE TO RELATED APPLICATIONS

The present application claims benefit of U.S. Provisional Application Ser. No. 60/001,669, filed Jul. 31, 1995.

The present application is a divisional of U.S. patent application Ser. No. 08/777,307 filed Dec. 27, 1996, now U.S. Pat. No. 5,971,253, which in turn is a continuation of U.S. patent application Ser. No. 08/681,847, filed Jul. 29, 1996, now abandoned.

FIELD OF THE INVENTION

The present invention relates to components and methods for making connections in microelectronic devices.

BACKGROUND OF THE INVENTION

Microelectronic devices such as semiconductor chips require large numbers of electrical connections in a small area. For example, a complex semiconductor chip may have hundreds of contacts for signal input and output and for power supply, all within an area of a few $cm^2$. These contacts must be reliably connected to corresponding contact pads on a substrate such as a chip mount, circuit panel or multichip module. The connection between the chip and the substrate must meet numerous, often contradictory requirements and desires. It should be low in cost, and yet highly reliable. It should require only the minimum amount of area on the substrate. Ideally, the connected chip should be accommodated in an area of the substrate approximately equal to that of the chip itself. The connections should be robust and capable of withstanding repeated changes in the temperature of the chip and the substrate, and the associated differential thermal expansion and contraction of the chip and substrate. Moreover, the connection systems should not impose unusual or costly requirements in fabrication of the chip or substrate. The connection system desirably should facilitate testing of the chip, and the connection system itself, before the chip is finally assembled to the substrate. All of these considerations, taken together, represent a formidable engineering challenge. These considerations are present, to a greater or lesser degree, in other connections used in microelectronic devices as, for example, connections between substrates or circuit panels.

Numerous solutions to these problems have been proposed heretofore. One common method of making connections to a semiconductor chip or a similar device is wire bonding. In wire bonding, numerous fine wires are connected to the contact pads of the chip and extend outwardly, over the edges of the chip, to corresponding contact pads on a substrate. The process requires individual connections of each contact on the chip and also requires an area of the substrate substantially larger than the chip itself. In a further method referred to as tape automated bonding or "TAB", fine metallic leads are disposed on a polymeric tape. The leads may be connected individually or en masse to the contact pads of the chip and to the contact pads of the substrate. This method also requires a substantial area of the chip substrate surface. In so-called "flip-chip" bonding, the front or contact-bearing surface of the chip faces downwardly to the substrate, and each contact on the chip is connected to the corresponding contact pad on the substrate by a solder column. This method can mount a chip in an area of the substrate substantially equal to the area of the chip itself, but suffers from drawbacks such as poor resistance to thermal cycling, cost and process difficulties.

Numerous other chip mounting methods have been proposed. For example, Patraw, U.S. Pat. Nos. 4,695,870 and 4,716,049 disclose a package for a microelectronic chip utilizing hollow metallic "compressive pedestals" engaged between the chip and the substrate and making a spring-loaded electrical connection. McMahon, U.S. Pat. No. 5,321,583, discloses a second level interconnect, i.e., an interconnect arranged to connect an already packaged device to a circuit panel. This interconnect uses apparently solid metallic spheres disposed between the package and the circuit panel and an external spring to maintain engagement of all of the components. Tsukagoshi et al., U.S. Pat. No. 5,120,665, discloses an isotropic electrically conductive adhesive with numerous deformable electroconductive particles disposed therein. The particles may include a polymeric core with a thin metallic layer, typically less than about 1 micron thick. These particles are distributed at random between a chip and a substrate, so that those particles which are engaged between contacts of the chip and contact pads on the substrate will permit electrical conduction between the so-engaged pad and contact. As noted in International Interconnection Intelligence Flip Chip Technology Impact Report, pp. 3–79 to 3–80, a Seiko Epson Corporation process uses gold plated resin balls mixed with adhesive and printed onto a substrate contact. The substrate is then engaged with a chip and secured by a separate adhesive. Despite these efforts in the art, still further improvement would be desirable.

SUMMARY OF THE INVENTION

One aspect of the present invention provides methods of making microelectronic element assemblies. Methods according to this aspect of the present invention desirably include the steps of providing a plurality of deformable, electrically conductive elements, each such element including a thin, flexible metallic shell extending over at least a portion of the surface of the conductive element, and connecting the conductive elements to contacts on the microelectronic element so that the metallic shells are exposed, and then connecting the microelectronic element to a substrate by bonding the shells of the conductive elements to contact pads on the substrate. Because the shells are flexible, they can deform as the test probes engage the shells. The shells therefore can compensate for deviations from perfect planarity of the microelectronic element, of the shells themselves, or of the substrate. This helps to assure reliable engagement between the contact pads on the substrate and the shells. The method according to this aspect of the invention may also include the step of testing the microelectronic element prior to substrate bonding by forcibly engaging the substitute contact pads, or pads of a test probe, with the exposed shells and applying signals to the microelectronic element through the engaged robes and shells.

Each shell may be in the form of a hollow spheroid such as a hollow sphere. Each conductive element may incorporate a mass of a flexible, compressible polymeric material such as an elastomer inside the spheroidal shell. The polymeric material may itself be in the form of a hollow spheroid, such as a hollow polymeric sphere. Alternatively, each shell may be empty. The shells may be bonded to the contacts of the microelectronic element before or after engagement to the substrate, as by forming a metallurgical bond, by soldering, brazing, diffusion bonding, eutectic bonding or similar methods. These bonding methods may be performed using bonding materials carried by the shells themselves.

In a method according to a further embodiment of the invention, each conductive element incorporates a soft, electrically conductive material such as a conductive polymer, partially cured or uncured conductive adhesive or the like, extending outside of the shell. Thus, each shell may be in the form of a dome-like cap overlying one end of a soft conductive element. These conductive elements can be engaged with the contacts of the microelectronic elements so that the soft conductive materials bears of the contacts and is bonded thereto, whereas the dome-like shells project away from the microelectronic element. For example, the conductive elements can extend through holes in a dielectric sheet having a first side and a second side, with the soft conductive elements being disposed on the first side and the dome-like shells protruding outwardly from the second side. The entire sheet, with the conductive elements thereon, can be juxtaposed with the microelectronic element so as to engage all of the contacts on the microelectronic element with the conductive elements carried by the sheet simultaneously. Conductive elements incorporating the spheroidal shells discussed above may also be provided within holes of a dielectric sheet. Desirably, each such spheroidal element protrudes beyond each of the first and second surfaces of the sheet, so that numerous spheroidal shells can be engaged with numerous contacts on the microelectronic element simultaneously by juxtaposing the sheet and the microelectronic element.

Further aspects of the present invention provide components for connecting microelectronic elements. Connection components according to this aspect of the invention desirably include a dielectric sheet having first and second surfaces and having holes extending between the surfaces, and also include electrically conductive elements, one such electrically conductive element being disposed within each such hole. Preferably, the sheet is flexible. Each such conductive element includes a thin, flexible metallic shell exposed at the second surface of the dielectric sheet. In one embodiment, each such shell is spheroidal and is exposed at the first surface of the dielectric sheet. Desirably, each such spheroidal shell protrudes beyond the surfaces of the sheet at both surfaces. Each such shell may be hollow and may include a polymeric material disposed within the shell. Such polymeric material may itself be in the form of a hollow spheroidal body. The polymeric material may be soft and flexible. Each such shell may include interruptions extending through its wall. Such interruptions are provided to permit movement of the interior polymeric material during compression of the shell. Preferably, each such shell is less than about 10 microns thick, and may be formed by processes such as electroless plating, electroplating or sputtering on the polymeric material. The shells may be formed from metals such as gold, nickel, copper, titanium and alloys and combinations thereof, and may include shape memory alloys, commonly referred to as superplastic materials. Electrically conductive bonding materials desirably overlie each shell.

Alternatively, each conductive element may incorporate a mass of a soft, electrically conductive material disposed in each hole of the sheet and extending to the first surface thereof. Where such a soft electrically conductive material is employed, each shell may be either a spheroidal shell seated in the soft material or a convex, dome-like shell capping the conductive material at the second surface of the sheet.

Still further aspects of the present invention provide methods of making connection components.

These and other objects, features and advantages of the present invention will be more readily apparent from the detailed description of the preferred embodiments set forth below, taken in conjunction with the accompanying drawings.

DETAILED DESCRIPTION OF THE PREFERRED EMBODIMENTS

Figure 1:
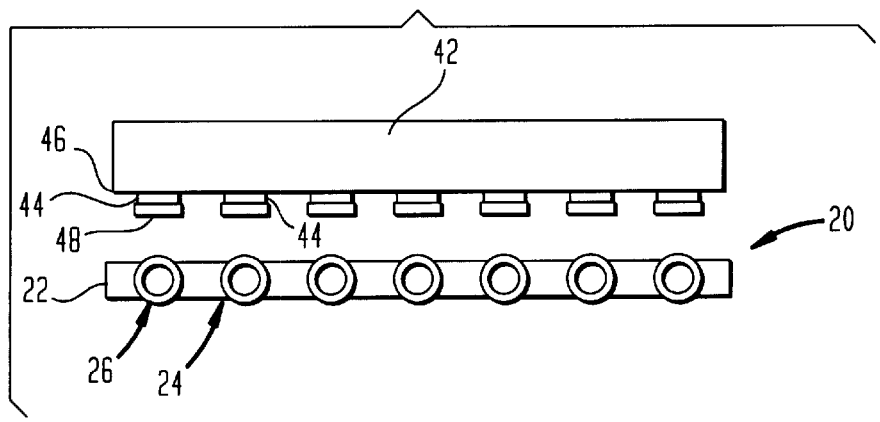
FIG. 1 is a diagrammatic sectional view depicting a component in accordance with one embodiment of the present invention together with a microelectronic device.
Figure 8:
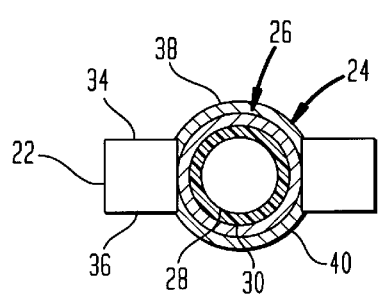
FIG. 8 is a fragmentary, diagrammatic sectional view depicting portions of a component according to FIGS. 1–3.

As shown in FIG. 1, a connection component 20 in accordance with one embodiment of the present invention incorporates a dielectric sheet 22, such as a sheet of a flexible but substantially inextensible material such as a polyimide about 15 to about 30 microns thick. Connection component 22 has holes 24 disposed in a regular, predetermined pattern. Each hole 24 has an electrically conductive element 26 disposed therein. As best seen in FIG. 8, each conductive element 26 incorporates a flexible body 28 covered by a thin, flexible conductive shell 30. In the embodiment illustrated, each body 28 is in the form of a hollow sphere. Flexible body 28 may be formed from essentially any flexible polymer which is compatible with the manufacturing process used to fabricate the system and which does not cause corrosion or other adverse reactions with the surrounding components during use. Preferred polymers include thermoplastics such as polystyrene, polyethlyene, acetal, polybutadiene and polyetherimide and thermosets such as epoxies and polyimide. Elastomers and gels such as silicone elastomers, silicone gels, and other natural and synthetic elastomers can be used. Each polymeric body desirably has a diameter between about 50 and about 150 $\mu$m. The wall thickness of the body is selected depending upon the properties of the polymer to provide a body flexible enough to deform as described below under relatively low loads, so as to avoid imposing damaging stresses on other components. For relatively soft polymers such as elastomers, gels and the softer thermoplastics, the wall thickness may be so great that the body is entirely solid.

Each shell 30 is formed from a highly conductive material suitable for making connections to semiconductor chips. Metallic conductive materials are particularly preferred. Particularly preferred metallic conductive materials include gold, silver, platinum, nickel, palladium, copper, titanium and alloys and combinations thereof. The shell may be formed in a single layer of uniform composition, in multiple layers of different compositions or as one or more layers having progressively graded composition. The shell may be formed on the exterior of the polymeric body 28 by conventional metal deposition processes such as sputtering, chemical vapor deposition, plasma enhanced chemical vapor deposition, electroless plating and electroplating. Particularly preferred metals for the shell include gold, nickel, copper, titanium and alloys and combinations thereof. Gold is especially preferred. The shell preferably is less than about 3 microns thick, and more preferably between about 1 and about 2 microns thick. Alloys of the type referred to as "shape memory" alloys, also known as superplastic alloys may be employed. These alloys provide good deformability and fatigue resistance during service. However, they generally relatively low electrical conductivity. Where a shape memory alloy or other material of low conductivity is employed for part of the shell, a further layer should be provided on the outside of such material, the further layer including a highly conductive material such as copper or, more preferably, gold.

Figure 9A:
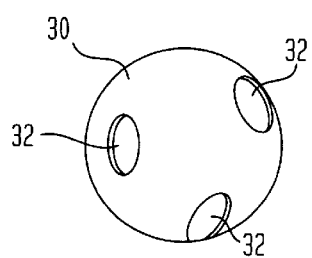
FIGS. 9a and 9b are fragmentary perspective views depicting portions of components according to further embodiments.
Figure 9B:
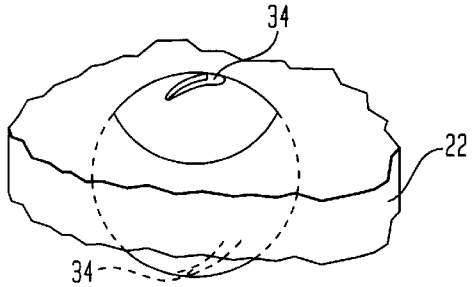

As illustrated in FIG. 9a, each shell 30 has interruptions formed therein at random locations on its surface. The interruptions desirably are relatively small in comparison to the radius of the shell. That is, each interruption preferably is a spot having a diameter less than the radius of the shell and preferably less than about half of the radius of the shell. Alternatively, the interruptions may be formed as slits 34 (FIG. 9b) through the shell. Holes 32 can be formed by passing the shells, at random orientation, through one or more pulsed radiant energy beams, such as KrF excimer laser beams. For example, the conductive elements, with the shells thereon, can be poured repeatedly through a confined space while directing the radiant energy beams into the space. The actual location and formation of the openings on each sphere are random, and the number of openings formed in each sphere are also theoretically random in this process. Slits 34 can be formed after the conductive elements are positioned in the holes of dielectric sheet 22. Thus, the radiant energy beam may be scanned across the surface of the sheet and pulsed upon reaching each conductive element. This places a preselected number of interruptions in each shell at preselected locations relative to the dielectric sheet. Regardless of the method used to form the interruptions in the shell, it is preferred that the shell remain continuous. That is, each portion of the shell surface desirably remains connected to each other portion of the shell surface by a path leading across still other portions of the shell surface.

The conductive elements are mounted in holes 24 by any suitable mechanical means as, for example, by rolling a large number of conductive elements over the surface of the sheet so that one conductive element becomes lodged in each hole, removing any excess conductive elements and then forcing the conductive elements downwardly into the holes, as by pressing the conductive elements with a flat platen while supporting the dielectric sheet on a platen having holes aligned with the holes in the dielectric sheet. After assembly, each conductive element extends entirely through dielectric sheet 22, from the first surface 34 of the sheet to the second surface 36, and each conductive element protrudes slightly from each surface of the dielectric sheet.

Each conductive element 26 is provided with an electrically conductive bonding material 38 covering the portion of shell 30 exposed on the first surface 34 of the dielectric sheet, and with a similar conductive bonding material 40 covering that portion of the shell exposed on second surface 36. Conductive bonding material 38 may be essentially any conductive bonding material capable of forming an electrically conductive bond between the shell and the mating contacts and contact pads. Bonding materials 38 and 40 may be the same or different. Preferred bonding materials include diffusion bonding alloys, eutectic bonding alloys, solders, brazing alloys and conductive materials incorporating polymers, such as inherently conductive polymers, thermoplastic polymers with small particulate conductive additives and thermosetting polymers with particulate conductive additives. The bonding materials may be applied after assembly of the conductive elements to the dielectric sheet, by conventional processes commonly used to deposit such material such as selective electroplating, silk screening or stenciling. The location of the bonding material on each conductive element is not particularly critical, although it should extend over the point of maximum protrusion from the dielectric sheets and should not extend to the next adjacent conductive element. Alternatively, the bonding material can be applied onto the outer surface of the shells before the conductive elements are assembled to the dielectric sheet.

In an assembly process according to a further embodiment of the invention, connection component 20, including the dielectric sheet 22 with the conductive elements 26 thereon is juxtaposed with a microelectronic device 42 such as a semiconductor chip having contacts 44 disposed in a preselected pattern on its front or contact-bearing surface 46. Contacts 44 are connected to the internal components (not shown) of element or chip 42. Each contact 44 may be provided with a "bump" or coating 48 of a material such as gold adapted to facilitate bonding of the contact by the bonding material carried on the conductive elements 26. The pattern of contacts 44 on surface 46 corresponds to the pattern of holes 24 and conductive elements 26 extending through the dielectric sheet 22. However, the connection component may include some excess conductive elements. For example, the contacts of the chip may be disposed at some locations of a so-called "area array" or regular grid pattern, whereas the conductive elements 26 of the connection component may be provided at all locations of the grid pattern. Thus, the same type of connection component can be used for different chips having contacts at different selected locations of the grid.

Figure 2:
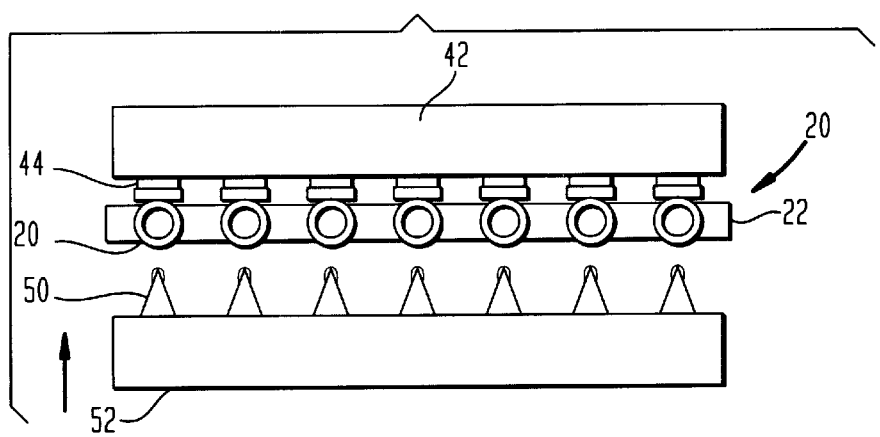
FIGS. 2 and 3 are similar to FIG. 1, but depict the component and microelectronic element at later stages of the connection process.

The dielectric sheet is juxtaposed with microelectronic device 42 so that one hole, and hence one conductive element 26, is aligned with each contact 44 of the device, whereupon the connection component and microelectronic device are engaged with one another so as to engage one conductive element with each contact on the device. The connection component may be aligned with the microelectronic device using conventional techniques such as are commonly employed to align semiconductor chips with automated bonding tapes or substrates, such as machine-vision systems, manual alignment using a microscope or the like. After alignment, the conductive elements 26 can be engaged with contacts 44 by pressing the conductive elements against the contacts. As illustrated in FIG. 2, the conductive elements can be engaged with individual contacts 50 of a test fixture 52. The contact pads 50 of the test fixture are also arranged in a pattern corresponding to the pattern of conductive elements and contacts, such as the regular grid pattern mentioned above. The microelectronic device and test fixture are advanced toward one another and held in position by a clamp or fixture (not shown), so that each conductive element 26 is engaged between one contact 44 on the device and one contact 50 on the test fixture. In this condition, neither the conductive elements 26 nor the dielectric sheet 22 of the connection component 20 is bonded to the microelectronic device. Rather, electrical connections are established by the forcible engagement between contacts 24, conductive elements 26 and contact pads 50.

Both the flexibility of sheet 22 and the flexibility of the shells 30 facilitate simultaneous engagement of all of the chip contacts and all of the contact pads 50. Thus, sheet 20 can bend to accommodate conditions where the contacts 44 and contact pads 50 are not precisely coplanar. Each conductive element 26, and hence each shell, is deformed slightly by engagement with the mating contact and contact pad. The flexibility of the shell compensates for differences in the vertical distances between device contacts 44 and test fixture contacts 50. Such differences may be caused by differences in the heights of the contacts, and differences in the diameters of the conductive elements themselves. Because the system can compensate for such differences, all of the conductive elements can be reliably engaged with the chip contact and test fixture contact pads. During such engagement, the microelectronic device 42 may be actuated by supplying signals, power or both through the test fixture. Such actuation may include a short term test, and may also include long-term operation or "burn-in". This test actuation detects both defects in the microelectronic device and defects in the connection component 20, such as missing or defective elements 26.

Figure 3:
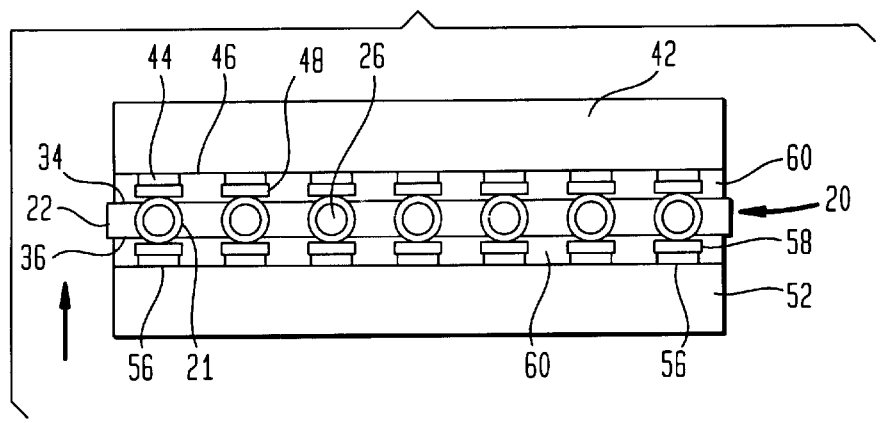

Following test, the test fixture is removed. As shown in FIG. 3, a substrate 54 having contact pads 56 in a similar regular pattern is engaged with the connection component and a microelectronic element. The contact pads 56 of the substrate may be formed from a material adapted for bonding with the bonding materials carried on the connection component, and may have a coating 58 of a material adapted to facilitate such bonding. For example, where the contact pads are formed from copper, and the bonding material 40 (FIG. 8) on the second surface 36 of the component is a diffusion bonding alloy, pad 56 may be provided with a coating 58 formed from gold or other diffusion bondable metal. Pads 56 are connected to conductors (not shown) within the substrate. Substrate 54 may be a circuit panel; a chip mounting, or an active microelectronic device. For example, both device 42 and substrate 54 can be semiconductor chips, so that the mounting serves to interconnect the chips to one another. Alternatively, substrate 54 may be a circuit panel incorporated in a so-called "multichip module" and may have connections for mounting other microelectronic devices such as additional chips, as well as internal circuitry (not shown) connecting the various elements mounted to the substrate.

Substrate 54 and microelectronic device 42 are urged together by conventional means such as clamping platens (not shown) and the bonding materials 38 and 40 (FIG. 8) are activated simultaneously, as by heating. Here again, the flexibility of dielectric sheet 22 and the deformability of the shells and conductive elements provides good engagement for all of the contact pads and contacts. Thus, even where both the microelectronic element 42 and substrate 54 are rigid elements, and even where the contacts of the chips and/or the contact pads of the substrate are slightly out of plane or of different heights, good connections can be made to all of the chip contacts. The bonding material disposed at the first surface 34 of the dielectric sheet forms bonds between the device contacts 44 and the conductive shells, whereas the bonding material on the of the second side 36 of the dielectric sheet forms bonds between the substrate contact pads 56 and the shells of the conductive elements. This establishes a permanent electrical connection between each contact of the microelectronic and the corresponding contact pad on the substrate. After bonding, a compliant dielectric encapsulant 60 is injected between the microelectronic device and dielectric sheet 22 and between the dielectric sheet and the substrate. The dielectric encapsulant may be a curable liquid material such as a silicone elastomer or gel. It is injected in liquid form and then cured to provide a permanent environmental seal.

The finished assembly provides reliable low-impedance connections between the chip and the substrate, in an area of the substrate no larger than the chip itself. Moreover, it provides good resistance to thermally-induced stresses. Because each conductive element 26 is flexible, it can deform to permit relative motion of the device contact 46 and substrate contact 56 bonded thereto. For example, where differential thermal expansion of the device and substrate cause movement in the horizontal or x-y directions parallel to the contact-bearing surfaces of the microelectronic element (to the left and right as seen in FIG. 3), the conductive element, including its metallic shell can deform slightly. Also, if thermally induced stresses cause warping of the device, the substrate or both, dielectric sheet 22 can flex. Also, each conductive element can be compressed or elongated somewhat in the vertical directions, normal to the surfaces of the chip and substrate (upwardly and downwardly in FIG. 3) so as to permit relative movement over a limited range, sufficient to compensate for warpage.

The interruptions 32 or 34 (FIGS. 9a and 9b) in the shells permit the polymeric core 28 (FIG. 8) to bulge outwardly as the shell is compressed, thereby relieving internal pressure which might otherwise tend to rupture the shell. Also, they reduce the spring constant of the shell and hence permit deformation with relatively low forces.

In a variant of the method discussed above, substrate 54 itself is used as a test fixture and hence test fixture 52 (FIG. 2) is not employed. In this variant, the chip and substrate are brought together, with connection component 20 disposed therebetween, so that each conductive element 26 is compressed between the associated device contact 44 and substrate contact pad 56. At this stage of the process however, the bonding materials are not activated, so that the contacts are maintained only under mechanical pressure. The microelectronic device and substrate may be actuated and tested. If they prove satisfactory, the bonding materials may then be activated to form a permanent bond, and the encapsulant may be injected. In a further variant of this process, the device and substrate are held against one another in the same manner and, after optionally testing the assembly, the encapsulant is injected and cured while maintaining the force of engagement between the device and substrate. After the encapsulant is cured, the externally applied forces are released, and the encapsulant holds the assembly together. Each conductive element 26 tends to return to its original shape under the influence of its own resiliency. However, because the encapsulant holds the device and substrate in position relative to one another, each conductive element is retained in a compressed condition and bears effectively on the device contact and substrate contact pad. This creates a permanent mechanically engaged connection. The bonding materials are omitted in this variant.

Figure 4:
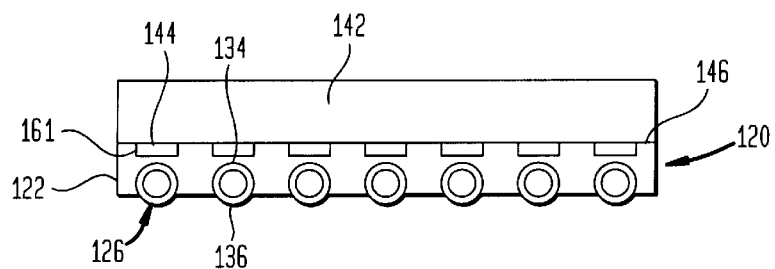
FIGS. 4, 5 and 6 are views similar to FIG. 1, but depict components according to further embodiments of the invention.

As illustrated in FIG. 4, a connection component 120, having conductive elements 126 similar to those discussed above, may be permanently mounted to the microelectronic device 142 to form a subassembly, which is then engaged with a substrate, such as the substrate discussed above, and attached thereto. Thus, the dielectric sheet 122 overlies the contact-bearing surface 146 of the device, and each conductive elements 126 of the connection component is electrically connected to one contact 144 of the device. The connection component may be secured to the device by a layer of an adhesive 161, which may incorporate an anisotropic conductive adhesive in the vicinity of the contacts to make the electrical connection between the shell of the conductive element and the various contacts. Alternatively, a bonding material on the portion of the conductive element facing towards the device contact may be activated to bond each conductive element to the associated device contact. Thus, the conductive elements are bonded to each device contact before the substrate is assembled. After assembly of the substrate, the substrate contact pads are bonded to the conductive elements. The conditions used to activate the bonding material for bonding the substrate should not disturb the bonds previously made with the contact pads 144. Thus, the bonding material applied to the conductive elements 126 on the first or device side 134 may be a relatively high-temperature solder or diffusion bonding alloy, whereas the bonding material applied to the conductive elements on the second or substrate side 136 may be a relatively low-temperature solder or bonding alloy. Also, the bonding material on the second or substrate side may be applied after assembly of the connection component 120 to device 142. In a further variant, the bonding materials may be provided on the device contacts, on the substrate contact pads, or both, so that the corresponding bonding materials need not be applied on the connection component. In yet another variant, the material of the shell 30 itself may serve as part or all of the bonding material. For example, the shell may be formed in whole or in part from tin, so as to form an eutectic bond with mating gold contacts.

In the embodiments discussed above, the conditions used to activate the bonding materials typically include heat. The polymeric cores may melt or soften during the bonding process. Such melting or softening normally does not affect performance of the finished device. However, violent gas evolution from the polymeric body is not desirable. Preferably, the maximum temperature achieved during the bonding operation is below the heat deflection temperature of the polymeric core but above its Tg or glass transition temperature.

A connection component 220 (FIG. 5) according to yet another embodiment of the invention incorporates a dielectric sheet 222 having holes 224 therein and also having conductive elements 226 extending through each hole. Here again, each conductive element incorporates a shell 230. Each shell is aligned with one hole 224. Each shell 230 is not a closed, generally spheroidal shape. Rather, each shell is in the form of a spherical segment or hemisphere. Each such shell is disposed at the second or device side 236 of dielectric layer 220 and protrudes outwardly from such second surface. The convex surface 232 of each shell faces away from surface 236 and away from the dielectric layer 220, whereas the concave side 234 faces towards the dielectric layer and opens towards the associated hole 224.

A mass 228 of a soft, electrically conductive material is disposed within each hole and extends from each hole to fill the interior of the associated shell 230. Each mass 228 also extends from the first or device side 234. Thus, each shell 230 and mass 228 form a composite conductive element. Masses 228 may be formed from electrically conductive polymers such as inherently conductive polymers or polymers loaded with particulate conductive materials. Silver-filled flexible epoxies and flexible elastomers are preferred. Preferably, the soft conductive material is a curable material such as a partially-cured or "b-stage" epoxy or polyester resin loaded with silver or other conductive particles. The conductive masses 228 may be formed by silk screening or stenciling the conductive material. The shells may be formed by plating a metal onto the second side of the dielectric layer, and onto the exposed surfaces of masses 228.

In use, the component is engaged with a device 242, and the soft, conductive materials are bonded to the contacts 244 of the device. An encapsulant (not shown) may be injected between dielectric sheet 220 and the device. The resulting subassembly can be tested by engagement with a test fixture, such as test fixtures 52 (FIG. 2) or by engagement with a substrate under mechanical load. Shells 230 facilitate such testing. Typically, it is difficult to make effective contact with a solder or conductive polymer "bump". The metal of the shell desirable does not oxidize to an appreciable degree, and therefore provides a good surface for pressure contact engagement. Further, the component can be permanently secured to a substrate by bonding, using bonding materials carried either on the shell or on the contact pads as the substrate in the manner discussed above. The relatively soft conductive material masses 228 may have appreciable height, on the order of about 125 to about 175 microns, and therefore can flex to accommodate relative movement of the device contacts and substrate contacts.

Figure 5:
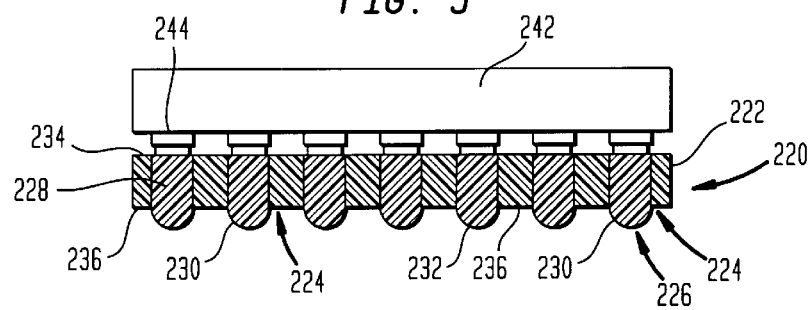
Figure 6:
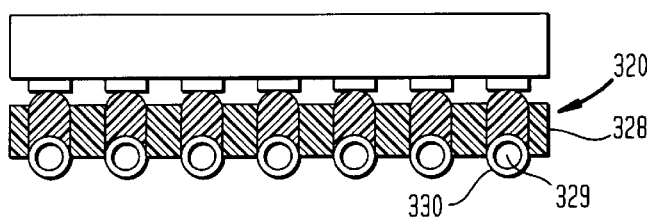

The subassembly of FIG. 6 is generally similar to that shown in FIG. 5, except that each shell 330 is a spheroidal shell, similar to shells 30 discussed above. Each such hollow spheroidal shell may itself have a polymeric core 329, which in turn may be hollow or solid. Each such shell is continuous with a mass of soft conductive material 328 disposed within the associated hole in the dielectric sheet 320. Here again, the shell and the polymeric mass 328 form a composite conductive element extending through the dielectric sheet.

Figure 7:
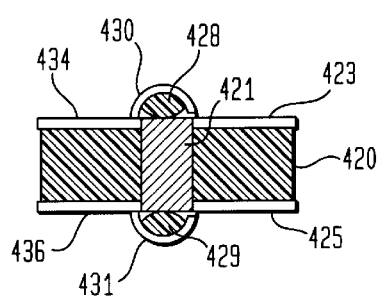
FIG. 7 is a fragmentary of a sectional view on an enlarged scale depicting a portion of a component according to a further embodiment of the invention.

In the arrangement of FIG. 7, the dielectric sheet 420 is provided with metal-filled vias 421 extending between its first and second surfaces. The vias can be formed by conventional methods, such as laser ablation of the polymeric sheet to form a hole, electroless plating and electroplating to form a conductor extending entirely through the dielectric sheet. Continuous sheets of electrically conductive material such as copper 423 and 425 are provided on the first and second surfaces 434 and 436 respectively of the dielectric sheet. After formation of the vias and conductive sheets, small masses of a flexible polymer 428 and 429 are deposited on the vias by silk screening or stenciling a curable material or by other conventional depositing processes. Thin, flexible shells 430 and 431 are then formed by electrolessly plating the entire assembly to provide a "seed" layer on the surfaces of masses 428 and 429, and then electroplating a shell metal using conductive layers 423 and 425 to carry the plating current.

This forms a plurality of composite conductive elements, each including the thin, flexible shell 430 at one end, the conductive material 421 in the via and the thin flexible shell 431 at the opposite end. After the plating step, conductive layers 423 and 425 are etched so as to electrically isolate each composite conductive element from the others. The resulting connection component has the flexible shells protruding from both sides of the dielectric sheet. It can be used in substantially the same way as connection component 20 discussed above.

The roles of the device and the substrate in the embodiments discussed above can be reversed. That is, a subassembly of the connection component and the substrate can be fabricated, and then joined to the device.

Figure 10:
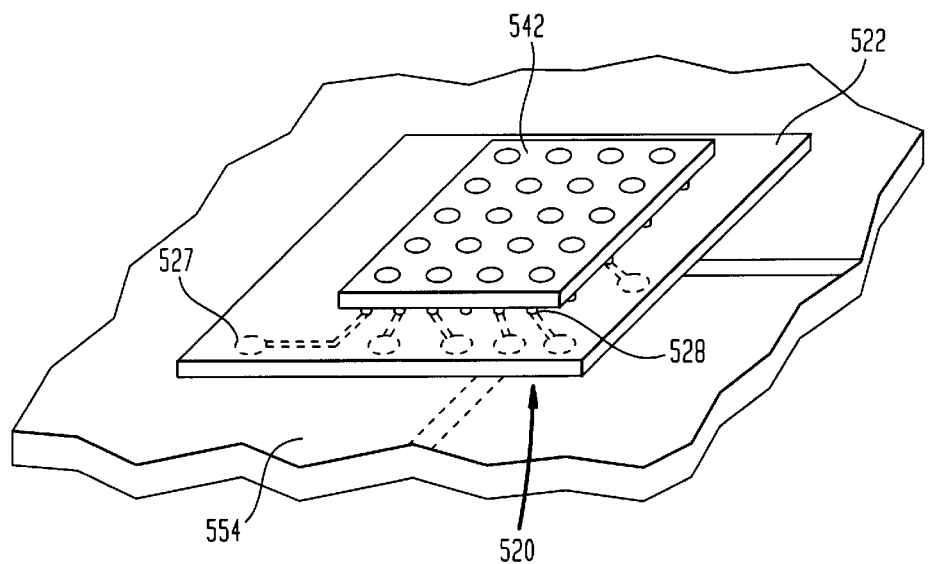
FIG. 10 is a diagrammatic perspective view of an assembly in accordance with a further embodiment.

As shown in FIGS. 10 and 11a, a connection component of 520 in accordance with yet another embodiment of the invention includes a polymer sheet 522 having holes 524 extending therethrough. Holes 524 may be about 0.012 inches (about 0.3 mm) in diameter. Here again, the dielectric sheet may be between about 25 and about 75 μm thick. A pad 523 is formed at each hole 524 on the second or substrate side 536 of the dielectric sheet. A composite conductive element 526 is provided by stenciling a small column or "mass" of a curable elastomeric material 528 on each pad 523, within each hole 524, so that the mass of compliant material 528 protrudes upwardly through the hole 524 and extends beyond the first or device side of 534 of the dielectric sheet. An electrically conductive shell 530 is formed over each mass 528 by masking the first surface 534 except at the holes 524, electrolessly plating and then electroplating. Pads 523 may be initially provided as a part of a larger, electrically continuous sheet or assembly, and this sheet or assembly may be used to convey the electroplating current. Following the electroplating operation, the sheet or assembly may be etched to separate the pads 523 from one another. Each shell 530 is electrically and mechanically connected to the associated pad 523.

Figure 11:
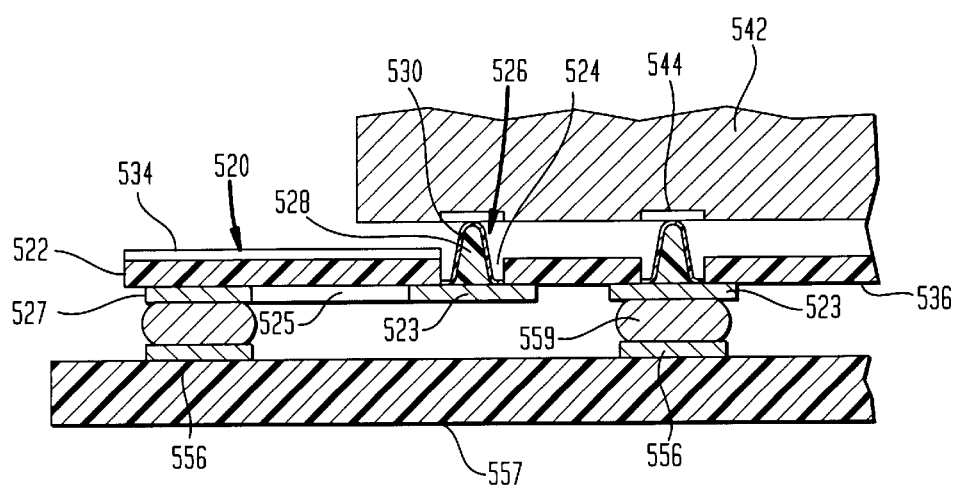
FIG. 11 is a diagrammatic sectional view along lines 11—11 in FIG. 10.

This connection component can be used in conjunction with a chip or other device 542 and a substrate 554. The conductive shells 530 are bonded to the contacts 544 over the chip using bonding material carried out on the shells or on the contacts Pads 523 are connected to contacts 556 of the substrate. As seen in FIG. 11, each pad 523 may be bonded to the contact pads 556 of the substrate by a conventional solder bump 559. Some of the pads 523 are provided with leads 525 extending in the horizontal directions along dielectric sheet 522 to auxiliary bonding pads 527. These auxiliary pads are secured to the contact pads 556 of the substrate.

As shown in FIG. 10, connection component 520 is fabricated as a partial "fan out" structure. That is, the chip 542 conductive elements 526 and pads 523 are disposed in a central region of dielectric sheet 522 whereas at least some of the auxiliary pads 527 are disposed in a peripheral region of the sheet. Thus, leads extending from pads 523 to auxiliary pads 527 extend in outward horizontal directions, from the central direction to the peripheral direction. The contacts thus "fan out" away from the chip and away from the central region. This effectively expands the array of pads to an area larger than the area of the chip, and spreads the electrical pads out over a wider area. Thus, the connections to the substrate 554 can be made using conventional surface mount or other simple techniques. The reverse arrangement can be used to provide a "fan-in" effect. That is, some chips have contacts disposed adjacent the periphery of the chip. To provide a fan-in arrangement, pads 523 and conductive elements 526 can be disposed adjacent the periphery of the dielectric sheet, whereas the auxiliary pads 527 can be provided adjacent the center of the dielectric sheet.

Numerous variations and combinations of the pages discussed above can be utilized without departing from the present invention. For example, each conductive element can be mounted to the associated contact on the device or substrate without using a dielectric sheet as in the embodiments discussed above. Thus, a plate formed from stainless steel or other bonding-resistant material may be disposed over the contact-bearing surface of the chip. The plate has holes aligned with the individual contacts. The conductive elements, such as those discussed above, are deposited in the plate, and bonded to the contacts, whereupon the plate is removed. Also, although the assembly operations discussed herein have been discussed with reference to a single microelectronic device or semiconductive chip, they can be performed in a wafer scale arrangement. Thus, a connection component can be fabricated as a sheet large enough to cover an entire wafer containing numerous semiconductor chips. The conductive elements of the connection component may be connected to the contacts of all of the chips on the wafer. The dielectric sheet and the wafer may then be severed to provide units, each including a portion of the dielectric sheet and a single chip. Desirably, an encapsulant is injected between the dielectric sheet and the wafer prior to such severance.

As these and other variations and combinations of the features discussed above can be utilized without departing from the present invention as defined by the claims, the foregoing description of the preferred embodiments should be taken by way of illustration rather than by way of limitation of the claimed invention.

What is claim is:

1. A connection component for mounting microelectronic devices comprising:
   (a) a dielectric sheet having first and second surfaces and having holes extending between said first and second surfaces: and
   (b) an electrically conductive element disposed within each said hole, each said electrically conductive element being exposed at the first surface of the sheet for engagement with a contact of a microelectronic device, each said electrically conductive element including a thin, hollow flexible metallic shell exposed at the second surface of the dielectric sheet and a polymeric material disposed within each said shell.

2. A component as claimed in claim 1 wherein each said shell is spheroidal.

3. A component as claimed in claim 2 wherein each said shell is exposed at the first surface of the dielectric sheet.

4. A component as claimed in claim 4 wherein each said shell has interruptions therein.

5. A component as claimed in claim 2 wherein said polymeric material within each shell is in the form of a hollow spheroidal body.

6. A component as claimed in claim 1 wherein said polymeric material is selected from the group consisting of elastomers and flexible epoxies.

7. A component as claimed in claim 1 wherein each said shell includes a layer of metallic material overlying the polymeric material and wherein each said shell is less than about 10 microns thick.

8. A component as claimed in claim 1 wherein each said shell is formed from a metal selected from the group consisting of gold, nickel, copper, titanium and alloys and combinations thereof.

9. A component as claimed in claim 1 wherein each said shell is formed from a shape memory alloy.

10. A component as claimed in claim 1 further comprising an electrically conductive bonding material disposed on each said shell.

11. A component as claimed in claim 1 wherein each said shell protrudes from the second surface of the dielectric sheet.

12. A connection component for mounting microelectronic devices comprising:
    (a) a dielectric sheet having first and second surfaces and having holes extending between said first and second surfaces; and
    (b) an electrically conductive element disposed within each said hole, each said electrically conductive element including a thin, hollow flexible metallic shell exposed at the second surface of the dielectric sheet and protruding from the second surface of the dielectric sheet; and c) a mass of a soft, electrically conductive material disposed in each said hole adjacent said first surface.

13. A component as claimed in claim 12 wherein said soft material includes a polymeric material.

14. A component as claimed in claim 12 wherein each said shell is an open shell having a convex side facing out of the hole at said second surface of the sheet and a concave side facing into the hole, the soft conductive material filling the interior of the shell.

15. A semiconductor chip assembly comprising:

(a) a semiconductor chip having a front surface with contacts thereon;

(b) a dielectric sheet separate from said chip, said sheet having first and second surfaces and having holes extending between said first and second surfaces: and (c) an electrically conductive element disposed within each said hole, each said electrically conductive element including a thin, flexible metallic shell exposed at the second surface of the dielectric sheet, said front surface of said semiconductor chip facing said first surface of said dielectric sheet, said contacts being aligned with said holes and electrically connected to said electrically conductive elements in said holes.

16. An assembly as claimed in claim 15 further comprising a substrate having contact pads thereon, said substrate facing said second surface of said dielectric sheet, contact pads being engaged with said shells of said electrically conductive elements and electrically connected through said electrically conductive elements to said contacts of said semiconductor chip.

17. An assembly as claimed in claim 16 wherein each said shell is engaged between a contact on the semiconductor chip and a contact on the substrate.

18. An assembly as claimed in claim 17 wherein each said shell is spheroidal and wherein each shell is bonded to a contact on the semiconductor chip and to a contact pad on the substrate.

19. An assembly as claimed in claim 16 wherein each said conductive element includes a mass of a soft, electrically conductive material disposed in each said hole adjacent said first surface.

20. An assembly as claimed in claim 19 wherein each said shell is an open shell having a convex side facing out of the hole at said second surface of the sheet and a concave side facing into the hole, the soft conductive material filling the interior of the shell and contacting one said contact on said semiconductor chip.

* * * * *

UNITED STATES PATENT AND TRADEMARK OFFICE
CERTIFICATE OF CORRECTION

PATENT NO. : 6,204,455 B1  Page 1 of 1
DATED : March 20, 2001
INVENTOR(S) : Gilleo et al.

It is certified that error appears in the above-identified patent and that said Letters Patent is hereby corrected as shown below:

Column 2,
Line 54, "robes" should read -- probes --.

Column 11,
Line 26, after "contacts" insert -- . --.

Column 12,
Line 36, "claim 4" should read -- claim 2 --.

Signed and Sealed this

Eleventh Day of September, 2001

*Attest:*

NICHOLAS P. GODICI
*Attesting Officer*  *Acting Director of the United States Patent and Trademark Office*

UNITED STATES PATENT AND TRADEMARK OFFICE
CERTIFICATE OF CORRECTION

PATENT NO. : 6,204,455 B1
DATED : March 20, 2001
INVENTOR(S) : Gilleo et al.

It is certified that error appears in the above-identified patent and that said Letters Patent is hereby corrected as shown below:

Column 2,
Line 54, "robes" should read -- probes --.

Column 11,
Line 26, after "contacts" insert -- . --.

Column 12,
Line 36, "claim 4" should read -- claim 2 --.

Signed and Sealed this

Twenty-seventh Day of November, 2001

Attest:

NICHOLAS P. GODICI
*Attesting Officer*  *Acting Director of the United States Patent and Trademark Office*